United States Patent
Byeon

(10) Patent No.: US 7,944,240 B2
(45) Date of Patent: May 17, 2011

(54) BUFFER OF SEMICONDUCTOR MEMORY APPARATUS

(75) Inventor: Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/494,808

(22) Filed: Jun. 30, 2009

(65) Prior Publication Data

US 2010/0090721 A1    Apr. 15, 2010

(30) Foreign Application Priority Data

Oct. 14, 2008   (KR) .................. 10-2008-0100645

(51) Int. Cl.
*H03K 19/094* (2006.01)
*H03K 19/0175* (2006.01)

(52) U.S. Cl. ................. 326/86; 326/34; 326/83; 326/90

(58) Field of Classification Search ........................ None
See application file for complete search history.

(56) References Cited

U.S. PATENT DOCUMENTS

| | | | |
|---|---|---|---|
| 5,999,032 A | 12/1999 | Wang et al. | |
| 6,054,874 A * | 4/2000 | Sculley et al. | ................... 326/83 |
| 7,161,513 B2 | 1/2007 | Werner et al. | |
| 7,269,212 B1 | 9/2007 | Chau et al. | |
| 7,542,507 B2 | 6/2009 | Sohn | |
| 7,635,990 B1 * | 12/2009 | Ren et al. | .......................... 326/86 |
| 2004/0150432 A1 * | 8/2004 | Poulton et al. | ................. 327/108 |
| 2007/0030055 A1 * | 2/2007 | Hasegawa | ..................... 327/543 |
| 2007/0089009 A1 | 4/2007 | Nishizawa | |

FOREIGN PATENT DOCUMENTS

| | | |
|---|---|---|
| KR | 102003008832 | 11/2003 |
| KR | 100735754 | 6/2007 |

* cited by examiner

*Primary Examiner* — Anh Q Tran
(74) *Attorney, Agent, or Firm* — Venable LLP; Jeffri A. Kaminski

(57) ABSTRACT

A buffer of a semiconductor memory apparatus includes a buffering section configured to generate an output signal by buffering an input signal. A mismatch compensation section generates a control voltage in correspondence with sizes of a second transistor of the same type as a first transistor constituting the buffering section, wherein the buffering section controls a transition time of the output signal in response to a level of the control voltage.

22 Claims, 3 Drawing Sheets

BUFFER OF SEMICONDUCTOR MEMORY APPARATUS

CROSS-REFERENCES TO RELATED PATENT APPLICATION

The present application claims priority under 35 U.S.C 119(a) to Korean Application No. 10-2008-0100645, filed on Oct. 14, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a buffer of the semiconductor memory apparatus.

2. Related Art

A general buffer includes first to fifth transistors P1, P2, and N1 to N3 as shown in FIG. 1. The first transistor P1 is applied with an external voltage VDD at a source thereof. A gate of the second transistor P2 is connected to a gate of the first transistor P1 and is applied with the external voltage VDD at a source thereof. The third transistor N1 receives an inverted input signal 'inb' at a gate thereof and a drain of the third transistor N1 is connected to the gate and a drain of the first transistor P1. The fourth transistor N2 receives an input signal 'in' at a gate thereof and a drain of the fourth transistor N2 is connected to a drain of the second transistor P2. The fifth transistor N3 receives an enable signal 'en' at a gate thereof and a drain of the fifth transistor N3 is connected to a node that is connected to a source of the third transistor N1 and a source of the fourth transistor N2 and a source of the fifth transistor N3 is connected to a ground terminal VSS. At this time, the inverted input signal 'inb' is a signal inverting the input signal 'in'. An output signal 'outb' is outputted from a node that is connected to the second transistor P2 and the fourth transistor N2.

An operation of the buffer will be described below.

When the enable signal 'en' is enabled at a high level and the input signal 'in' is at a high level, the fourth and fifth transistors N2 and N3 are turned on, such that the output signal 'outb' is at a low level.

When the enable signal 'en' is enabled at a high level and the input signal 'in' is at a low level, the first to third transistors P1, P2, and N1 are turned on and the output signal 'outb' is at a high level.

However, the buffer having this structure is vulnerable to process variation. More specifically, in the case in which the input signal 'in' is at a high level, a time in which the output signal 'outb' is transited to a low level may be shorter than a designed time when sizes of the fourth and fifth transistors N2 and N3 are larger than designed values due to the process variation. On the contrary, when sizes of the second and fourth transistors P2 and N2 are smaller than designed values, the time in which the output signal 'outb' is transited to a low level is lengthened.

Further, in the case in which the input signal 'in' is at a low level, a time in which the output signal 'outb' is transited to a high level is shortened or lengthened when the sizes of the first to third transistors P1, P2, and N1 are larger or smaller than designed values due to the process variation. In general, as the size of the transistor that is turned on increases, the transistor outputs a large amount of current and as the size of the transistor decreases, the transistor outputs a small amount of current, such that the above-mentioned problem occurs.

When the transition time of the output signal 'outb' is shortened or lengthened, an internal circuit that receives the output signal 'outb' may not perform a normal operation, such that operational reliability of the semiconductor memory apparatus decreases. As described above, only the process variation is regarded as a problem in operation of the buffer, but in the case of the buffer, a threshold voltage of the transistor varies by variation of a temperature and a voltage, such that an amount of current that is outputted from the transistor varies. Therefore, the transition time of the output signal may vary. Further, in the case in which the input signal 'in' is a clock signal, a clock signal outputted through the buffer may be a clock signal having a duty ratio different from at the time of inputting the buffer.

SUMMARY

A buffer of a semiconductor memory apparatus that can perform a stable operation in spite of variation in P.V.T (process, voltage, and temperature) is disclosed herein.

In one embodiment, a buffer of a semiconductor memory apparatus includes a buffering section configured to generate an output signal by buffering an input signal; and a mismatch compensation section configured to generate a control voltage in correspondence with sizes of a second transistor of the same type as a first transistor constituting the buffering section, wherein the buffering section controls a transition time of the output signal in response to a level of the control voltage.

In another embodiment, a buffer of a semiconductor memory apparatus includes a buffering section configured to generate an output signal by buffering an input signal; and a mismatch compensation section configured to increase a level of a first control voltage as a time in which the output signal is transited to a low level is lengthened and decrease a level of a second control voltage as a time in which the output signal is transited to a high level is lengthened, wherein the buffering section increases an amount of current that flows from the buffering section to a ground terminal when the level of the first control voltage increases and increases an amount of current that is supplied to the buffering section when the level of the second control voltage decrease.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
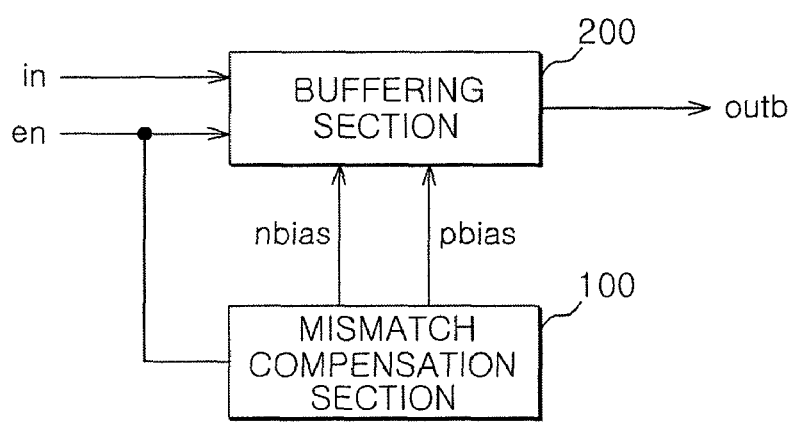
FIG. 2 is a schematic diagram of an exemplary buffer of a semiconductor memory apparatus according to one embodiment.

A buffer of a semiconductor memory apparatus according to one embodiment can be configured to include a mismatch compensation section 100 and a buffering section 200 as shown in FIG. 2.

The exemplary mismatch compensation section 100 is configured to generate a control voltage in correspondence with a size of a transistor. At this time, the mismatch compensation section 100 can generate a first control voltage 'nbias' in correspondence with a size of an NMOS-type transistor. Further, the mismatch compensation section 100 can generate a second control voltage 'pbias' in correspondence with a size of a PMOS-type transistor. For example, the mismatch compensation section 100 can decrease a level of the first control voltage 'nbias' as the size of the NMOS-type transistor constituting the buffering section 200 increases and increase a level of the second control voltage 'pbias' as the size of the PMOS-type transistor constituting the buffering section 200 increases. In general, the size of the transistor can be determined by an amount of current that is outputted from the transistor when the transistor is turned on. As the size of the transistor that is turned on increases, the transistor outputs a larger amount of current and the transistor outputs a smaller amount of current as the size of the transistor that is turned on decreases.

The buffering section 200 can buffer an input signal 'in' and output the input signal 'in' as an output signal 'outb'. At this time, the buffering section 200 can control a transition time of the output signal 'outb' depending a level of the control voltage. For example, the buffering section 200 is configured to quicken a time in which the output signal 'outb' is transited to a low level when the level of the first control voltage 'nbias' increases. Further, the buffering section 200 is configured to quicken a time in which the output signal 'outb' is transited to a high level when the level of the second control voltage 'pbias' decreases.

Figure 3:
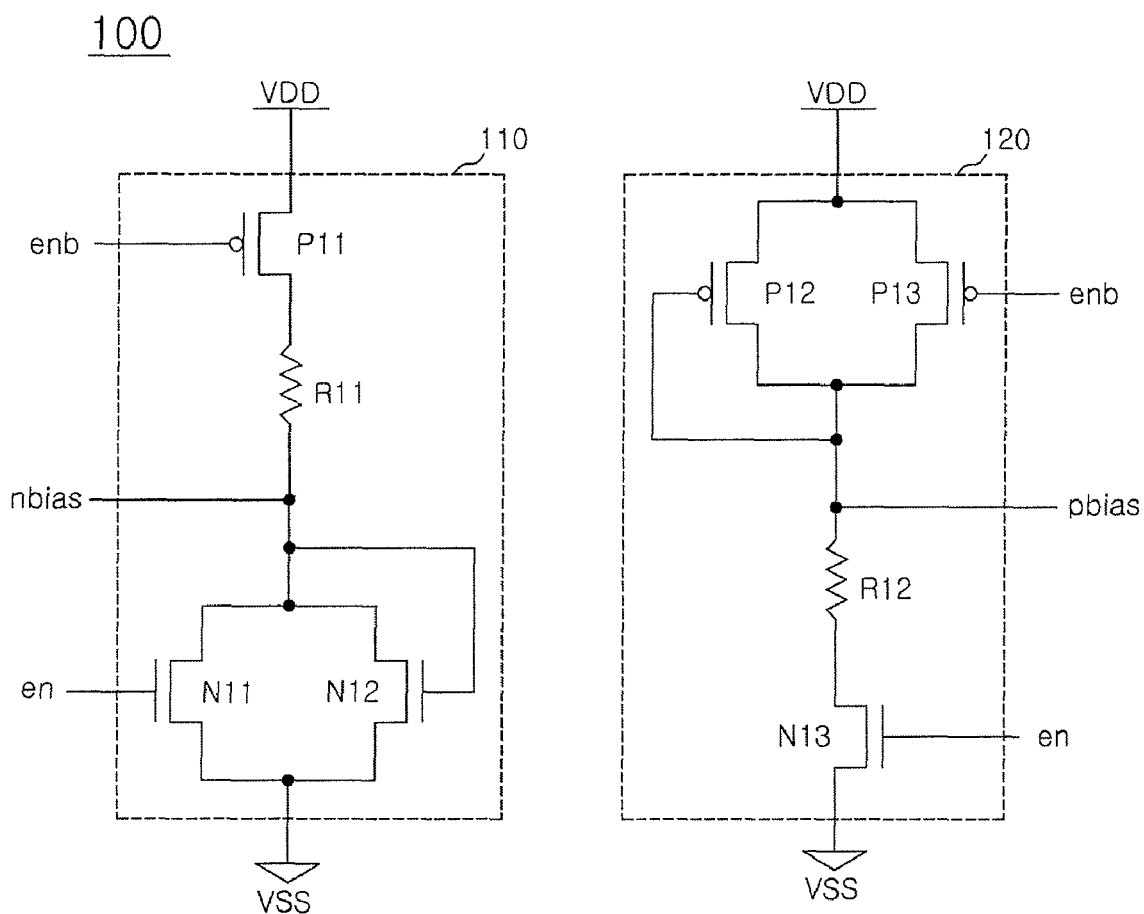
FIG. 3 is a configuration diagram of an exemplary mismatch compensation unit shown in FIG. 2 according to one embodiment.

The mismatch compensation section 100 can be configured to include a first control voltage generation unit 110 and a second control voltage generation unit 120 as shown in FIG. 3.

The first control voltage generation unit 110 can decrease the level of the first control voltage 'nbias' as the size of the NMOS-type transistor among the transistors constituting the buffering section 200 increases. Since the NMOS transistors constituting an internal circuit (composed of a buffer, a driver, etc.) of the semiconductor memory apparatus are manufactured in the same process, the transistors are influenced by the same process variation.

The first control voltage generation unit 110 can be configured to include first to third transistors P11, N11, and N12 and a first resistor R11. The first transistor P11 receives an enable signal 'enb' having an inverted level at a gate thereof and is applied with an external voltage VDD at a source thereof. A drain of the first transistor P11 is connected to one end of the first resistor R11. The second transistor N11 receives the enable signal 'en' at a gate thereof. The other end of the first resistor R11 is connected to a drain of the second transistor N11 and a ground terminal VSS is connected to a source of the second transistor N1. The other end of the first resistor R11 is connected to a gate and a drain of the third transistor N12 and the ground terminal VSS is connected to a source of the third transistor N12. At this time, the first control voltage 'nbias' is outputted from a node that is connected to the first resistor R11 and the second and third transistors N11 and N12.

The above-configured first control voltage generation unit 110 can output a voltage between the other end of the first resistor R11 and the ground terminal VSS as the first control voltage 'nbias'. Therefore, when sizes of the second and third transistors N11 and N12 that are connected between the first resistor R11 and the ground terminal VSS increase, the second and third transistors N11 and N12 allow a large amount of current to flow to the ground terminal VSS, such that the level of the first control voltage 'nbias' decreases.

The second control voltage generation unit 120 is configured to increase the level of the second control voltage 'pbias' when the size of the PMOS transistor constituting the buffering section 200 increases. Since the PMOS transistors constituting an internal circuit (composed of the buffer, the driver, etc.) of the semiconductor memory apparatus are manufactured in the same process, the transistors are influenced by the same process variation.

The second control voltage generation unit 120 can be configured to include fourth to sixth transistors P12, P13, and N13 and a second resistor R12. The fourth transistor P12 is applied with the external voltage VDD at a source thereof. The fifth transistor P13 receives the enable signal 'enb' having the inverted level at a gate thereof and is applied with the external voltage VDD at a source thereof. A gate and a drain of the fourth transistor P12 are connected to a drain of the fifth transistor P13. A node that is connected to the fourth and fifth transistors P12 and P13 is connected to one end of the second resistor R12. The sixth transistor N13 receives the enable signal 'en' at a gate thereof. The other end of the second resistor R12 is connected to a drain of the sixth transistor N13 and the ground terminal VSS is connected to a source of the sixth transistor N13. At this time, the second control voltage 'pbias' is outputted from a node that is connected to the fourth and fifth transistors P12 and P13 and the second resistor R12.

In the case of the above-configured second control voltage generation unit 120, when the sizes of the fourth and fifth transistors P12 and P13 increase, an amount of current that is supplied to the second resistor R12 increases, such that the level of the second control voltage 'pbias' increases.

Figure 4:
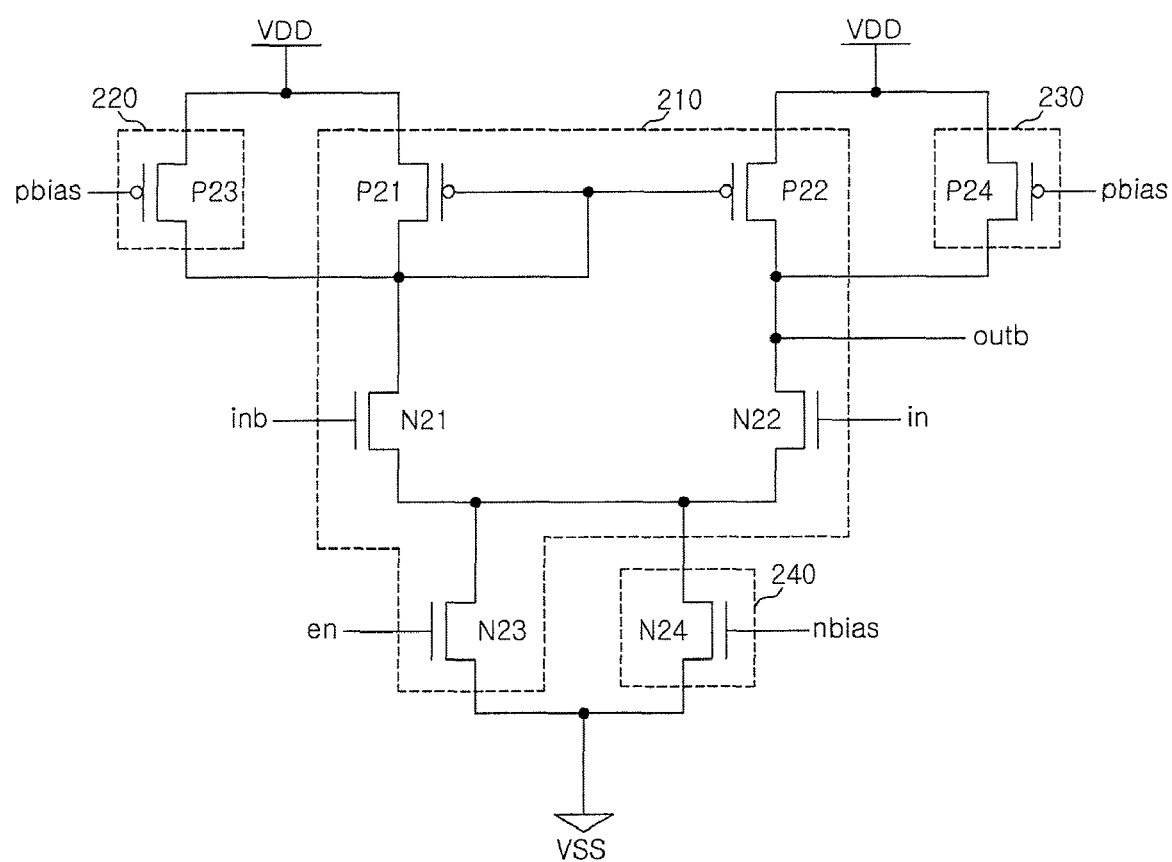
FIG. 4 is a configuration diagram of a buffering unit shown in FIG. 2 according to one embodiment.

Referring now to FIG. 4, the exemplary buffering section 200 can be configured to include a buffer unit 210, first and second current source units 220 and 230, and a current sink unit 240.

The buffer unit 210 can generate the output signal 'outb' by buffering the input signal 'in'.

The buffer unit 210 can determine the level of the output signal 'outb' by a difference in level between the input signal 'in' and the inverted input signal 'inb'. For example, the buffer unit 210 can transit the output signal 'outb' to a low level when the input signal 'in' is at a high level and the inverted input signal 'inb' is at a low level. Meanwhile, the buffer unit 210 can transit the output signal 'outb' to a high level when the input signal 'in' is at a low level and the inverted input signal 'inb' is at a high level.

The buffer unit 210 can be configured to include seventh to eleventh transistors P21, P22, N21, N22, and N23. The seventh transistor P21 is applied with the external voltage VDD at a source thereof. The eighth transistor P22 is applied with the external voltage VDD at a source thereof and a gate of the seventh transistor P21 is connected to a gate of the eighth transistor P22. The ninth transistor N21 receives the inverted input signal 'inb' at a gate thereof and a drain and the gate of the seventh transistor P21 are connected to a drain of the ninth transistor N21. The tenth transistor N22 receives the input signal 'in' at a gate thereof and a drain of the eighth transistor P22 is connected to a drain of the tenth transistor N22. The eleventh transistor N23 receives the enable signal 'en' at a gate thereof, a node that is connected to sources of the tenth and eleventh transistors N21 and N22 are connected to a drain of the eleventh transistor N23, and the ground terminal VSS is connected to the source of the eleventh transistor N22. At this time, the output signal 'outb' is outputted from a node that is connected to the eighth transistor P22 and the tenth transistor N22.

The first current source unit 220 can control the amount of current that is supplied to the buffer unit 210 depending on the level of the second control voltage 'pbias'. For example, the first current source unit 220 can increase the amount of current that is supplied to the buffer unit 210 as the level of the second control voltage 'pbias' decreases. Meanwhile, the first current source unit 220 can decrease the amount of current that is supplied to the buffer unit 210 as the level of the second control voltage 'pbias' increases.

The first current source unit 220 can be configured to include a twelfth transistor P23. The twelfth transistor P23 is applied with the second control voltage 'pbias' at a gate thereof and the external voltage VDD at a source thereof. A node that is connected to the seventh and ninth transistors P21 and N21 is connected to a drain of the twelfth transistor P23.

The second current source unit 230 can control the amount of current that is supplied to the buffer unit 210 depending on the level of the second control voltage 'pbias'. For example, the second current source unit 230 can increase the amount of current that is supplied to the buffer unit 210 as the level of the second control voltage 'pbias' decreases. Meanwhile, the second current source unit 230 can decrease the amount of current that is supplied to the buffer unit 210 as the level of the first control voltage 'pbias' increases.

The second current source unit 230 can be configured to include a thirteenth transistor P24. The thirteenth transistor P24 is applied with the second control voltage 'pbias' at a gate thereof and the external voltage VDD at a source thereof. A node that is connected to the eighth and tenth transistors P22 and N22 is connected to a drain of the twelfth transistor P23.

The current sink unit 240 can control an amount of current that flows to the ground terminal VSS from the buffer unit 210 in response to the level of the first control voltage 'nbias'. For example, the current sink unit 240 can increase the amount of current that flows to the ground terminal VSS from the buffer unit 210 as the level of the first control voltage 'nbias' increases.

The current sink unit 240 can be configured to include a fourteenth transistor N24. The fourteenth transistor N24 is applied with the first control voltage 'nbias' at a gate thereof. A node that is connected to sources of the ninth and tenth transistors N21 and N22 is connected to a drain of the fourteenth transistor N24 and the ground terminal VSS is connected to a source of the fourteenth transistor N24.

An exemplary operation of the buffer of the semiconductor memory apparatus according to one embodiment and an operation of the known buffer will be compared and described below.

Figure 1:
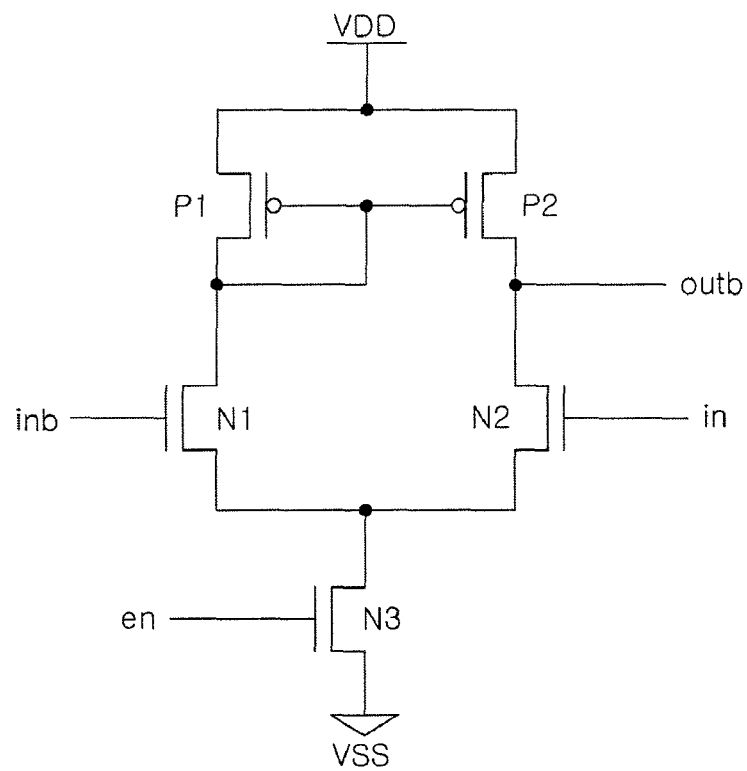
FIG. 1 is a configuration diagram of a known buffer of a semiconductor memory apparatus.

When an input signal 'in' is at a high level, a transistor N2 is turned on, such that the known buffer of the semiconductor memory apparatus shown in FIG. 1 can transit an output signal 'outb' to a low level. Further, when the input signal 'in' is at a low level, a transistor P2 is turned on, such that the output signal 'outb' is transited to a high level. At this time, in the case in which the output signal 'outb' is transited to a low level, a time in which the output signal 'outb' is transited to a low level is lengthened when a size of the transistor N2 decreases. In the case in which the output signal 'outb' is transited to a low level, the time in which the output signal 'outb' is transited to a low level is shortened when the size of the transistor N2 increases. Further, in the case in which the output signal 'outb' is transited to a high level, a time in which the output signal 'outb' is transited to a high level is lengthened when a size of the transistor P2 decreases and the time in which the output signal 'outb' is transited to a high level is shortened when the size of the transistor P2 increases.

A transition timing of the output signal may depend on the sizes of the transistors constituting the known buffer. The buffer that transmits signals between an external circuit and an internal circuit or between the internal circuit and the internal circuit of the semiconductor memory apparatus generates an output signal of which a transition timing varies, resulting in a mal-operation between the circuits.

The operation of the buffer of the semiconductor memory apparatus according to one embodiment will be described below with reference to FIGS. 3 and 4.

In the case in which a size of a tenth transistor N22 that transits an output signal 'outb' to a low level decreases, sizes of second and third transistors N11 and N12 among transistors P11, N11, and N12 that constitute a first control voltage generation unit 110 also decrease. The reason for this is that transistors of the same type are manufactured through the same process. As the sizes of the second and third transistors N11 and N12 decrease, a level of a first control voltage 'nbias' increases.

When the level of the first control voltage 'nbias' increases, a turn-on degree of a fourteenth transistor N24 that is applied with the first control voltage 'nbias' increases, such that a source voltage level of the tenth transistor N22 decreases. A gate-source voltage difference of the tenth transistor N22 increases, such that a turn-on degree of the tenth transistor N22 increases. Accordingly, even though the size of the tenth transistor N22 decreases, the turn-on degree of the tenth transistor N22 increases, such that it is possible to prevent a time in which the output signal 'outb' is transited to a low level from being lengthened.

In an opposite case, when the size of the tenth transistor N22 increases, the sizes of the second and third transistors N11 and N12 of the same type increase. When the sizes of the second and third transistors N11 and N12 increase, the level of the first control voltage 'nbias' decreases. When the level of the first control voltage 'nbias' decreases, the turn-on degree of the fourteenth transistor N24 decreases, such a source voltage level of the tenth transistor N22 increases. The gate-source voltage difference of the tenth transistor N22 decreases, such that the turn-on degree of the tenth transistor N22 decreases. Accordingly, even though the size of the tenth transistor N22 increases, the turn-on degree of the tenth transistor N22 decreases, such that it is possible to prevent the time in which the output signal 'outb' is transited to a low level from being shortened.

Meanwhile, in the case in which a size of an eighth transistor P22 that transits the output signal 'outb' to a high level decreases, sizes of fourth and fifth transistors P12 and P13 constituting the second control voltage generation unit 120 also decrease. The reason for this is that transistors of the same type are manufactured through the same process. When the sizes of the fourth and fifth transistors P12 and P13 decrease, a level of a second control voltage 'pbias' decreases.

When the level of the second control voltage 'pbias' decreases, a turn-on degree of a thirteenth transistor P24 that is applied with the second control voltage 'pbias' increases. The turn-on degree of the thirteenth transistor P24 increases even though the size of the eighth transistor P22 decreases, such that it is possible to prevent a time in which the output signal 'outb' is transited to a high level from being lengthened.

In an opposite case, when the size of the eighth transistor P22 increases, the level of the second control voltage 'pbias' increases. When the level of the second control voltage 'pbias' increases, the turn-on degree of the thirteenth transistor P24 that is applied with the second control voltage 'pbias' decreases. The turn-on degree of the thirteenth transistor P24 decreases even though the size of the eighth transistor P22 increases, such that it is possible to prevent the time in which the output signal 'outb' is transited to a high level from being shortened.

An example of the buffering operation of the semiconductor memory apparatus will be described below with respect to current. In general, in the case of a circuit constituting a semiconductor memory apparatus, a response speed depends on an amount of current that flows in the circuit. That is, as the amount of current that flows in the circuit increases, a speed to generate an output signal in response to an input signal increases and as the amount of current decreases, the speed to generate the output signal in response to the input signal decreases.

Transistors P21 and P22 constituting a buffer unit 210 shown in FIG. 4 serve to supply current to the buffer unit 210. When sizes of the transistors P21 and P22 that supply the current to the buffer unit 210 decrease, a level of a second control voltage 'pbias' decreases and turn-on degrees of twelfth and thirteenth transistors P23 and P24 increase, such that an amount of current that is supplied to the buffer unit 210 through the twelfth and thirteenth transistors P23 and P24 increases. Accordingly, even though an amount of current that is supplied to the buffer unit 210 through the seventh and eighth transistors P21 and P22 decreases, the amount of current that is supplied to the buffer unit 210 through the twelfth and thirteenth transistors P23 and P24 increases, the amount of current supplied to the buffer unit 210 is constantly maintained.

Further, when the sizes of the seventh and eighth transistors P21 and P22 increase and thus the amount of current that is supplied to the buffer unit 210 through the seventh and eighth transistors P21 and P22 increases, the amount of current that is supplied to the buffer unit 210 through the twelfth and thirteenth transistors P23 and P24 decreases. Accordingly, the amount of current supplied to the buffer unit 210 is constantly maintained.

Meanwhile, ninth to eleventh transistors N21 to N23 constituting the buffer unit 210 serve to allow current to flow from the buffer unit 210 to a ground terminal VSS. When sizes of the ninth to eleventh transistors N21 to N23 decrease, a level of a first control voltage 'nbias' increases, such that a turn-on degree of a fourteenth transistor N24 increases.

The current that flows out from the buffer unit 210 is equal to a sum of current that flows out through the ninth to eleventh transistors N21 to N23 and current that flows out through the fourteenth transistor N24. When an amount of current that flows out through the ninth to eleventh transistors N21 to N23 increases, an amount of current that flows out through the fourteenth transistor N24 decreases and when the amount of current that flows out through the ninth to eleventh transistors N21 to N23 decreases, the amount of current that flows out through the fourteenth transistor N24 increases. Consequently, the sum of the amount of current that flows out through the ninth to eleventh transistors N21 to N23 and the amount of current that flows out through the fourteenth transistor N24 is constantly maintained.

Accordingly, the exemplary buffer of the semiconductor memory apparatus may constantly maintain the response speed by constantly controlling an amount of supplied current and an amount of current that flows. As a result, since the amount of current that flows in the buffer does not vary by process variation or external factors (temperature and voltage), the buffer of the semiconductor memory apparatus may perform a stable operation. That is, since the buffer of the semiconductor memory apparatus may constantly maintain a transition time of an output signal to improve operational reliability of the semiconductor memory apparatus.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A buffer of a semiconductor memory apparatus, comprising:
a buffering section configured to generate an output signal by buffering an input signal; and
a mismatch compensation section configured to generate a control voltage in correspondence with sizes of a second transistor of a same type as a first transistor constituting the buffering section,
wherein the buffering section controls a transition time of the output signal in response to a level of the control voltage, the buffering section as a differential amplifer type circuit receives the input signal and an inverse of the input signal, the mismatch compensation section generates independently a first control voltage and a second control voltage as the control voltage, wherein the first control voltage is a voltage of a node connected to a drain and a gate of the second transistor when its source is applied with a ground voltage, and the second control voltage is the voltage of the node connected to the drain and the gate of the second transistor when its source is applied with a driving voltage.

2. The buffer of claim 1, wherein when the first transistor constituting the buffering section and the second transistor constituting the mismatching compensation are manufactured by the same process.

3. The buffer of claim 2, wherein in the case of the mismatch compensation section, the level of control voltage is inversely proportional to the size of the second transistor.

4. The buffer of claim 3, wherein the mismatch compensation section includes:
a resistor configured to be applied with the driving voltage at one end thereof; and
the second transistor having the drain and the gate connected to a node which is connected to a other end of the resistor, and the source applied with the ground voltage,
wherein the control voltage is outputted from a node that is connected to the resistor and the second transistor.

5. The buffer of claim 2, wherein in the case of mismatch compensation section, the level of the control voltage is directly proportional to the size of the second transistor.

6. The buffer of claim 5, wherein the mismatch compensation section includes:
the second transistor configured to be applied with the driving voltage at the source thereof; and
a resistor having one end connected to the node connected to the drain and the gate of the second transistor and a other end applied with the ground voltage,
wherein the control voltage is outputted from a node connected to the second transistor and the resistor.

7. The buffer of claim 2, wherein the second transistor includes an NMOS transistor and a PMOS transistor, and
the control voltage includes the first control voltage and the second control voltage, and the mismatch compensation section includes:
a first control voltage generation unit configured to have a level of the first control voltage inversely proportional to the size of the NMOS transistor; and
a second control voltage generation unit configured to have a level of the second control voltage directly proportional to the size of the PMOS transistor.

8. The buffer of claim 7, wherein the first control voltage generation unit includes:
a resistor configured to be applied with the driving voltage at one end; and the NMOS transistor having a drain and a gate connected to a node which is connected to a other end of the resistor and a source applied with the ground voltage,
wherein the first control voltage is outputted from a node that is connected to the resistor and the NMOS transistor.

9. The buffer of claim 7, wherein the second control voltage generation unit includes:
the PMOS transistor configured to be applied with the driving voltage at a source thereof; and
a resistor having one end is connected to the node connected to a drain and a gate of the second transistor and a other end applied with a ground voltage, and
wherein the second control voltage is outputted from a node connected to the PMOS transistor and the resistor.

10. The buffer of claim 1, wherein in the case of the buffering section, when the level of the control voltage increases, a time in which the output signal is transited from a high level to a low level is shortened.

11. The buffer of claim 10, wherein the buffering section includes:
a buffer unit configured to generate the output signal by buffering the input signal; and
a current sink unit configured to control an amount of current that flows from the buffer unit to a ground terminal depending on the level of the control voltage,
wherein the buffer unit determines a level of the output signal by amplifying a voltage level difference of the input signal and the inverted input signal.

12. The buffer of claim 1, wherein in the case of the buffering section, when the level of the control voltage decreases, a time in which the output signal is transited from a low level to a high level is shortened.

13. The buffer of claim 12, wherein the buffering section includes:
a buffer unit configured to generate the output signal by buffering the input signal; and
a current source unit configured to control an amount of current that is supplied to the buffer unit depending on the level of the control voltage.

14. The buffer of claim 1, wherein the control voltage includes a first control voltage and a second control voltage, and
wherein in the case of the buffering section, when the first control voltage increases, a time in which the output signal is transited to a high level to a low level is shortened and when the second control voltage decreases, the time in which the output signal is transited from a low level to a high level is shortened.

15. The buffer of claim 14, wherein the buffering section includes:
a buffer unit configured to generate the output signal by buffering the input signal;
a current sink unit configured to control an amount of current that flows from the buffer unit to a ground terminal depending on the first control voltage; and
a current source unit configured to control an amount of current that is supplied to the buffer unit depending on the second control voltage.

16. A buffer of a semiconductor memory apparatus, comprising:
a buffering section configured to generate an output signal by buffering an input signal; and
a mismatch compensation section configured to increase a level of a first control voltage as a time in which the output signal is transited to a low level is lengthened and decrease a level of a second control voltage as a time in which the output signal is transited to a high level is lengthened,
wherein the buffering section increases an amount of current that flows from the buffering section to a ground terminal when the level of the first control voltage increases and increases an amount of current that is supplied to the buffering section when the level of the second control voltage decrease, the buffering section as a differential amplifer type circuit receives the input signal and an inverse of the input signal, and the mismatch compensation section generates independently the first control voltage and the second control voltage, the first control voltage is a voltage of a node connected to a drain and a gate of the second transistor when its source is applied with a ground voltage, and the second control voltage is a voltage of a node connected to the drain and the gate of the second transistor when its source is applied with a driving voltage.

17. The buffer of claim 16, wherein the mismatch compensation section includes:
a first control voltage generation unit configured to increase the level of the first control voltage as the time in which the output signal is transited to a low level is lengthened; and
a second control voltage generation unit configured to decrease the level of the second control voltage as the time in which the output signal is transited to a high level is lengthened.

18. The buffer of claim 17, wherein the first control voltage generation unit is configured to generate the first control voltage by using transistors of a same type as a transistor for connecting an output node outputting the output signal and a ground terminal when the output signal is transited to a low level among transistors constituting the buffering section.

19. The buffer of claim 18, wherein the first control voltage generation unit includes:
a resistor configured to be applied with the driving voltage at one end thereof; and
one of the transistors having a drain and a gate connected to a node connected to a other end of the resistor and a source applied with the ground voltage, and
wherein the first control voltage is outputted from a node that is connected to the resistor and the transistor.

20. The buffer of claim 17, wherein the second control voltage generation unit is configured to generate the second control voltage by using transistors of a same type as a transistor for connecting an output node and an external voltage terminal when the output signal is transited to a high level among the transistors constituting the buffering section.

21. The buffer of claim 20, wherein the second control voltage generation unit includes:
   one of the transistors configured to be applied with the driving voltage at a source thereof; and
   a resistor having one end connected to a node that is connected to a drain and a gate of the one of the transistors and a other end applied with the ground voltage, and
   wherein the second control voltage is outputted from the node that is connected to the transistor and the resistor.

22. The buffer of claim 16, wherein the buffering section includes:
   a buffer unit configured to generate the output signal by buffering the input signal;
   a current sink unit configured to increase an amount of current that flows from the buffer unit to the ground terminal as the level of the first control voltage increases; and
   a current source unit configured to increase an amount of current that is supplied to the buffer unit as the level of the second control voltage decreases.

* * * * *